(12) United States Patent
Kim et al.

(10) Patent No.: US 10,796,883 B2
(45) Date of Patent: Oct. 6, 2020

(54) DISCRETE CAPACITANCE SWITCHING CIRCUIT AND CAPACITOR ARRAY CIRCUIT INCLUDING THE SAME

(71) Applicant: SAMSUNG ELECTRONICS CO., LTD., Suwon-si, Gyeonggi-do (KR)

(72) Inventors: Jin-Ho Kim, Suwon-si (KR); Hyun-Bae Kim, Yongin-si (KR); Keon-Woo Kim, Daejeon (KR); Gun-Woo Moon, Daejeon (KR); Moo-Hyun Park, Daejeon (KR); Jae-Il Baek, Daejeon (KR)

(73) Assignees: SAMSUNG ELECTRONICS CO., LTD., Suwon-si, Gyeonggi-do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 86 days.

(21) Appl. No.: 16/240,178

(22) Filed: Jan. 4, 2019

(65) Prior Publication Data
US 2020/0006038 A1    Jan. 2, 2020

(30) Foreign Application Priority Data
Jun. 28, 2018  (KR) .......................... 10-2018-0074607

(51) Int. Cl.
*H01J 37/32* (2006.01)
*G05F 1/595* (2006.01)
*G05F 1/46* (2006.01)
*H03H 7/40* (2006.01)

(52) U.S. Cl.
CPC ........ *H01J 37/32091* (2013.01); *G05F 1/468* (2013.01); *G05F 1/595* (2013.01); *H01J 37/32183* (2013.01); *H03H 7/40* (2013.01)

(58) Field of Classification Search
CPC .......... H01J 37/32091; H01J 37/32183; H03H 7/38; H03H 5/12; H03H 7/40; G05F 1/595; G05F 1/468
See application file for complete search history.

(56) References Cited

U.S. PATENT DOCUMENTS 9,270,248 B2    2/2016  Bakalski et al.
9,281,802 B2    3/2016  Bakalski
9,515,633 B1   12/2016  Long et al.
(Continued)

FOREIGN PATENT DOCUMENTS

KR   10-2016-0046748   4/2016
KR   10-1632838        5/2016
(Continued)

*Primary Examiner* — Jared Fureman
*Assistant Examiner* — Duc M Pham
(74) *Attorney, Agent, or Firm* — F. Chau & Associates, LLC

(57) ABSTRACT

A discrete capacitance switching circuit includes a DC decoupling capacitor connected between a power node that receives an AC signal and a first node, a diode connected between the first node and a second node, a unit capacitor connected between the second node and a reference node that receives a ground voltage, and a bias circuit. The bias circuit is configured to apply a first DC voltage to the first node and apply a second DC voltage to the second node. The applied first and second DC voltages control a switching operation of the diode.

20 Claims, 19 Drawing Sheets

(56) References Cited

U.S. PATENT DOCUMENTS

| | | |
|---|---|---|
| 9,652,567 B2 | 5/2017 | Valcore, Jr. et al. |
| 9,761,414 B2 | 9/2017 | Marakhtanov et al. |
| 2006/0170516 A1* | 8/2006 | Marion ............... H01P 1/15 333/104 |
| 2008/0238569 A1* | 10/2008 | Matsuo ............... H03H 7/40 333/32 |
| 2010/0171557 A1* | 7/2010 | Tsukizawa ......... H03B 5/1265 331/17 |
| 2012/0286586 A1* | 11/2012 | Balm ................. H03F 1/56 307/109 |
| 2016/0134260 A1 | 5/2016 | Bhutta et al. |
| 2016/0149568 A1* | 5/2016 | Lee ................ H03K 17/04106 327/374 |
| 2017/0032938 A1 | 2/2017 | Bhutta |
| 2017/0372872 A1 | 12/2017 | Marakhtanov et al. |

FOREIGN PATENT DOCUMENTS

| | | |
|---|---|---|
| KR | 10-1659651 | 9/2016 |
| KR | 10-2017-0044010 | 4/2017 |
| KR | 10-2017-0083959 | 7/2017 |

\* cited by examiner

DISCRETE CAPACITANCE SWITCHING CIRCUIT AND CAPACITOR ARRAY CIRCUIT INCLUDING THE SAME

CROSS-REFERENCE TO RELATED APPLICATIONS

This application claims priority under 35 U.S.C. § 119 to Korean Patent Application No. 10-2018-0074607, filed on Jun. 28, 2018 in the Korean Intellectual Property Office (KIPO), the disclosure of which is incorporated by reference herein in its entirety.

TECHNICAL FIELD

Exemplary embodiments relate generally to semiconductor circuits, and more particularly, to a discrete capacitance switching circuit and a capacitor array circuit including the discrete capacitance switching circuit.

DISCUSSION OF THE RELATED ART

A configuration capable of varying a capacitance is utilized in semiconductor circuits for various purposes such as, for example, impedance matching. For example, a plasma chamber for processing a semiconductor wafer is included in apparatuses that perform etching, chemical vapor deposition (CVD), etc. to manufacture a semiconductor circuit. For such plasma processing, radio frequency (RF) power may be provided to the plasma chamber using an RF signal provided from an RF generator. Impedance of the plasma chamber is varied depending on operation conditions, and thus, impedance matching circuitry is utilized for efficient power transfer from the RF generator to the plasma chamber. As the time for the impedance matching increases and/or accuracy of the impedance matching decreases, efficiency is degraded and power consumption is increased in the manufacturing process of the semiconductor circuit.

SUMMARY

Exemplary embodiments may provide a discrete capacitance switching circuit capable of adjusting a capacitance value efficiently.

Exemplary embodiments may provide a capacitor array circuit including a discrete capacitance switching circuit capable of adjusting a capacitance value efficiently.

According to exemplary embodiments, a discrete capacitance switching circuit includes a direct current (DC) decoupling capacitor, a diode, a unit capacitor, and a bias circuit. The DC decoupling capacitor is connected between a power node that receives an alternating current (AC) signal and a first node. The diode is connected between the first node and a second node. The unit capacitor is connected between the second node and a reference node that receives a ground voltage. The bias circuit applies a first DC voltage to the first node and applies a second DC voltage to the second node. The first DC voltage and the second DC voltage control a switching operation of the diode.

According to exemplary embodiments, a discrete capacitance switching circuit includes a DC decoupling capacitor connected between a power node that receives an AC signal and a first node, a diode including a cathode electrode connected to the first node and an anode electrode connected to a second node, a unit capacitor connected between the second node and a reference node that receives a ground voltage, a bias circuit configured to apply a first DC voltage to the first node and apply a second DC voltage to the second node, in which the first and second DC voltages control a switching operation of the diode, a chalk inductor connected between the first node and a switching node, a first switch connected between the switching node and the reference node, a second switch connected between the switching node and a bias node that receives a bias voltage, a DC inductor connected between the second node and the reference node, and a reference capacitor connected between the power node and the reference node.

According to exemplary embodiments, a capacitor array circuit includes a reference capacitor and a plurality of discrete capacitance switching circuits. The reference capacitor is connected between a power node that receives an AC signal and a reference node that receives a ground voltage. The plurality of discrete capacitance switching circuits are connected in parallel between the power node and the reference node. Each of the plurality of discrete capacitance switching circuits includes a DC decoupling capacitor connected between the power node and a first node, a diode connected between the first node and a second node, a unit capacitor connected between the second node and the reference node, and a bias circuit configured to apply a first DC voltage to the first node and apply a second DC voltage to the second node, in which the first and second DC voltages control a switching operation of the diode.

The discrete capacitance switching circuit according to exemplary embodiments may improve performance and reliability of a semiconductor circuit including the discrete capacitance switching circuit by changing the capacitance value rapidly and accurately. The manufacturing time of the semiconductor circuit may be reduced by implementing a plasma processing system using the discrete capacitance switching circuit and/or the capacitor array circuit. In addition, the discrete capacitance switching circuit and the capacitor array circuit according to exemplary embodiments may improve the withstanding voltage problem of a semiconductor device operating at a high voltage.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
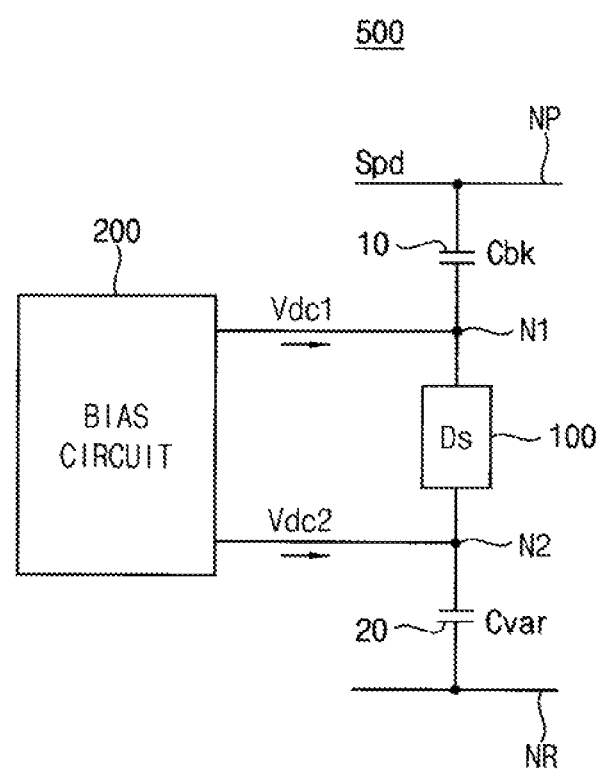
FIG. 1 is a diagram illustrating a discrete capacitance switching circuit according to exemplary embodiments.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that descriptions of features or aspects within each exemplary embodiment should typically be considered as available for other similar features or aspects in other exemplary embodiments, unless the context clearly indicates otherwise.

The terms "about" or "approximately" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a diagram illustrating a discrete capacitance switching circuit according to exemplary embodiments.

Referring to FIG. 1, in an exemplary embodiment, a discrete capacitance switching circuit 500 includes a direct current (DC) decoupling capacitor 10, a diode Ds 100, a unit capacitor 20 and a bias circuit 200.

The DC decoupling capacitor 10 is connected between a power node NP that receives an alternating current (AC) signal Spd and a first node N1. The diode 100 is connected between the first node N and a second node N2. The unit capacitor 20 is connected between the second node N2 and a reference node NR that receives a ground voltage.

The DC decoupling capacitor 10 may block a DC component of the AC signal Spd and pass an AC component of the AC signal Spd. Also, the DC decoupling capacitor 10 may reduce influences on the power node NP by the bias circuit 200. A bias voltage for a switching operation of the diode 100 may be lowered to a peak voltage of the AC signal Spd by blocking the DC component of the AC signal Spd using the DC decoupling capacitor 10. Thus, the discrete capacitance switching circuit 500 may improve the withstanding voltage problem of a semiconductor device operating at a high voltage.

The AC signal Spd may be a high-frequency signal such as, for example, a radio frequency (RF) signal. As will be described below, when the discrete capacitance switching circuit 500 is used for impedance matching of a plasma processing system, the AC signal Spd may be a plasma driving signal. The AC signal Spd may be an oscillating signal centered on a certain DC voltage such as, for example, a ground voltage. The ground voltage may be applied to the reference node NR as a DC voltage, and the ground voltage may be 0 V.

The bias circuit 200 may apply a first DC voltage Vdc1 to the first node N1 and apply a second DC voltage Vdc2 to the second node N2 to control a switching operation of the diode 100 (e.g., to turn the diode 100 on and off). For example, the switching operation of the diode 100 is controlled by the first DC voltage Vdc1 applied to the first node N1 and the second DC voltage Vdc2 applied to the second node N2.

In exemplary embodiments, a cathode electrode of the diode 100 may be connected to the first node N1 and an anode electrode of the diode 100 may be connected to the second node N2. In this case, the switching operation of the diode 100 may be controlled by changing the first DC voltage Vdc1 applied to the first node N1. The switching operation of the reverse-connected diode will be described below with reference to FIGS. 3 through 5B.

Depending on the switching operation of the diode 100, different capacitance values may be applied to the power node NP. As will be described below, a first capacitance value may be provided to the power node NP in a first operation mode while the diode 100 is turned on, and a second capacitance value lower than the first capacitance value may be provided to the power node NP in a second operation mode while the diode 100 is turned off.

A capacitance value Cbk of the DC decoupling capacitor 10 may be set to be sufficiently higher than a capacitance value Cvar of the unit capacitor 20. For example, the DC decoupling capacitor 10 may have a capacitance value Cbk capable of implementing a cutoff frequency that is lower than about $1/10$ frequency of the AC signal Spd, and the DC decoupling capacitor 10 may be implemented with a non-polar capacitor.

When the capacitance value Cbk of the DC decoupling capacitor 10 is sufficiently higher than the capacitance value Cvar of the unit capacitor 20, the first capacitance value in the first operation mode while the diode 100 is turned on may converge to the capacitance value Cvar of the unit capacitor 20. In the second operation mode while the diode 100 is turned off, the diode 100 may be considered to be a capacitor having a very small parasitic capacitance value, and thus, the second capacitance value may converge to zero. As a result, the capacitance value Cvar of the unit capacitor 20 may be a changing unit of the capacitance value of the discrete capacitance switching circuit 500.

In conventional circuits, it may be difficult to implement a sufficiently small capacitance value due to, for example, the withstanding voltage problem of a semiconductor device, a high capacitance value of a turned-off transistor, etc. In contrast, the discrete capacitance switching circuit 500 according to exemplary embodiments may reduce the capacitance value Cvar of the unit capacitor 20 down to a few picofarads (pF) by blocking the DC component using the DC decoupling capacitor 10 and performing the switching operation using the diode 100 having a small turn-off capacitance value.

As a result, the discrete capacitance switching circuit 500 according to exemplary embodiments may improve performance and reliability of a semiconductor circuit including the discrete capacitance switching circuit 500 by changing the capacitance value rapidly and accurately. The manufacturing time of the semiconductor circuit may be reduced by implementing a plasma processing system using the discrete capacitance switching circuit 500 and/or the capacitor array circuit including the discrete capacitance switching circuit 500. In addition, the discrete capacitance switching circuit 500 and the capacitor array circuit according to exemplary embodiments may improve the withstanding voltage problem of a semiconductor device operating at a high voltage.

Figure 2:
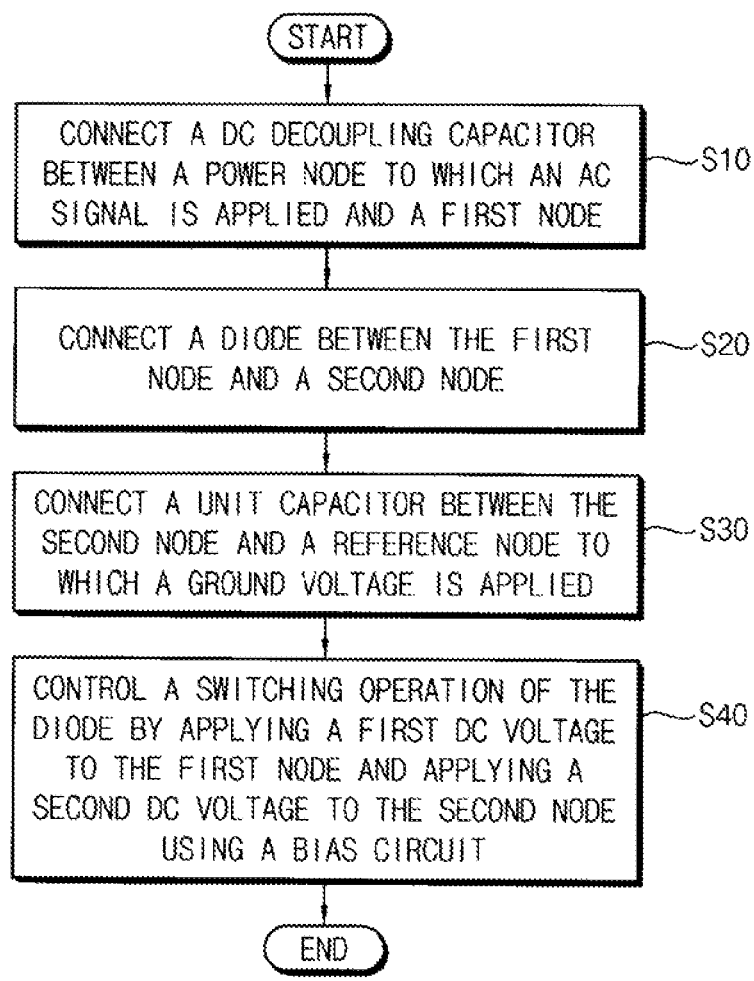
FIG. 2 is a flowchart illustrating a method of controlling a capacitance value according to exemplary embodiments.

FIG. 2 is a flowchart illustrating a method of controlling a capacitance value according to example embodiments.

Referring to FIGS. 1 and 2, in an exemplary embodiment, the DC decoupling capacitor 10 may be connected between the power node NP to which the AC signal Spd is applied and the first node N1 (S10). The diode 100 may be connected between the first node N1 and the second node N2 (S20). The unit capacitor 20 may be connected between the second node N2 and the reference node NR to which a ground voltage is applied (S30). Using the bias circuit 200, a switching operation of the diode 100 may be controlled by applying the first DC voltage Vdc1 to the first node N1 and applying the second DC voltage Vdc2 to the second node N2 (S40).

Figure 3:
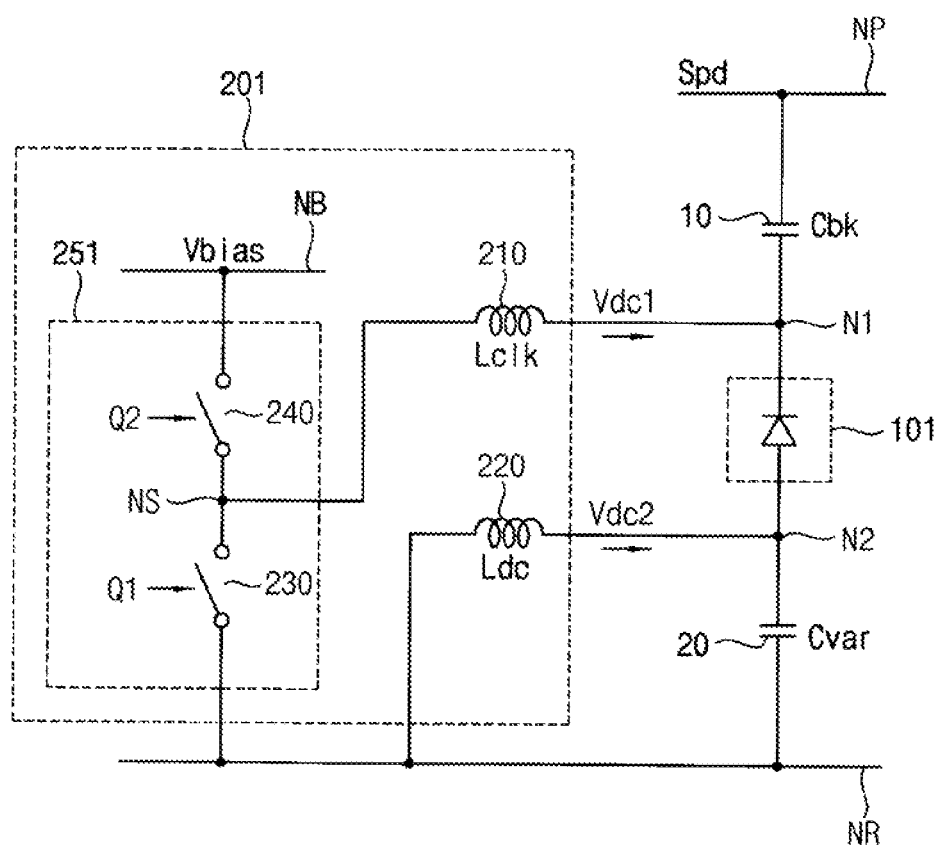
FIG. 3 is a circuit diagram illustrating a discrete capacitance switching circuit according to exemplary embodiments.

FIG. 3 is a circuit diagram illustrating a discrete capacitance switching circuit according to exemplary embodiments.

Referring to FIG. 3, in an exemplary embodiment, a discrete capacitance switching circuit 501 may include a DC decoupling capacitor 10, a diode 101, a unit capacitor 20, and a bias circuit 201.

The DC decoupling capacitor 10 is connected between a power node NP that receives an alternating current (AC) signal Spd and a first node N1. A cathode electrode of the diode 101 is connected to the first node N1 and an anode electrode of the diode 101 is connected to the second node N2. The unit capacitor 20 is connected between the second node N2 and a reference node NR that receives a ground voltage. As described above, the capacitance value Cbk of the DC decoupling capacitor 10 may be set to be sufficiently higher than the capacitance value Cvar of the unit capacitor 20.

The bias circuit 201 may apply a first DC voltage Vdc1 to the first node N1 and apply a second DC voltage Vdc2 to the second node N2 to control a switching operation of the diode 100 (e.g., to turn the diode 101 on and off). The bias circuit 201 may include a chalk inductor 210, a DC inductor 220, and a voltage selection circuit 251.

The chalk inductor 210 may be connected between the first node N1 and a switching node NS. The DC inductor 220 may be connected between the second node N2 and the reference node NR. The chalk inductor 210 and the DC inductor 220 may be set to have sufficiently high inductance values so as to pass only DC currents. For example, in an exemplary embodiment, the chalk inductor 210 and the DC inductor 220 may have capacitance values Lclk and Ldc to implement a resonance frequency that is higher than about ten times the high frequency of the AC signal Spd.

The voltage selection circuit 251 may selectively provide a bias voltage Vbias or a ground voltage to the switching node NS. The voltage selection circuit 251 may include a first switch 230 and a second switch 240.

The first switch 230 may be connected between the switching node NS and the reference node NR that receives the ground voltage. The second switch 240 may be connected between the switching node NS and a bias node NB that receives the bias voltage Vbias. The first switch 230 and the second switch 240 may operate switching operations in response to a first switching signal Q1 and the second switching signal Q2, respectively. Exemplary embodiments of the first switch 230 and the second switch 240 will be described below with reference to FIGS. 7A through 9B.

In the first operation mode, the first switch 230 may be turned on and the second switch 240 may be turned off to connect the switching node NS to the reference node NR to which the ground voltage is applied. The diode 101 may be turned on in the first operation mode as will be described below with reference to FIGS. 4A, 4B and 4C.

In the second operation mode, the first switch 230 may be turned off and the second switch 240 may be turned on to connect the switching node NS to the bias node NB to which the bias voltage Vbias is applied. The diode 101 may be turned off in the second operation mode as will be described below with reference to FIGS. 5A and 5B.

Hereinafter, the first and second operation modes of the discrete capacitance switching circuit 501 are described with reference to FIGS. 4A through 5B, in which the following assumptions are made.

Firstly, the inductance values Lclk and Ldc of the chalk inductor 210 and the DC inductor 220 may be sufficiently high so that only the DC currents may flow through the chalk inductor 210 and the DC inductor 220.

Secondly, the AC signal Spd applied to the power node NP may be an RF signal having a high frequency (e.g., 13.56 MHz) in the shape of a sinusoidal wave.

Thirdly, the bias voltage Vbias may be about equal to or higher than a peak voltage of the AC signal Spd.

Fourthly, the voltage drop when the diode 101 is turned off may be considered to be 0 V even though the voltage drop is not exactly zero (e.g., about 0.5 V to about 0.7 V).

Fifthly, the capacitance value Cbk of the DC decoupling capacitor 10 may be sufficiently higher than the capacitance value Cvar of the unit capacitor 20, and a parasitic capacitance value Cpara of the turned-off diode 101 may be sufficiently lower than the capacitance value Cvar of the unit capacitor 20.

Figure 4A:
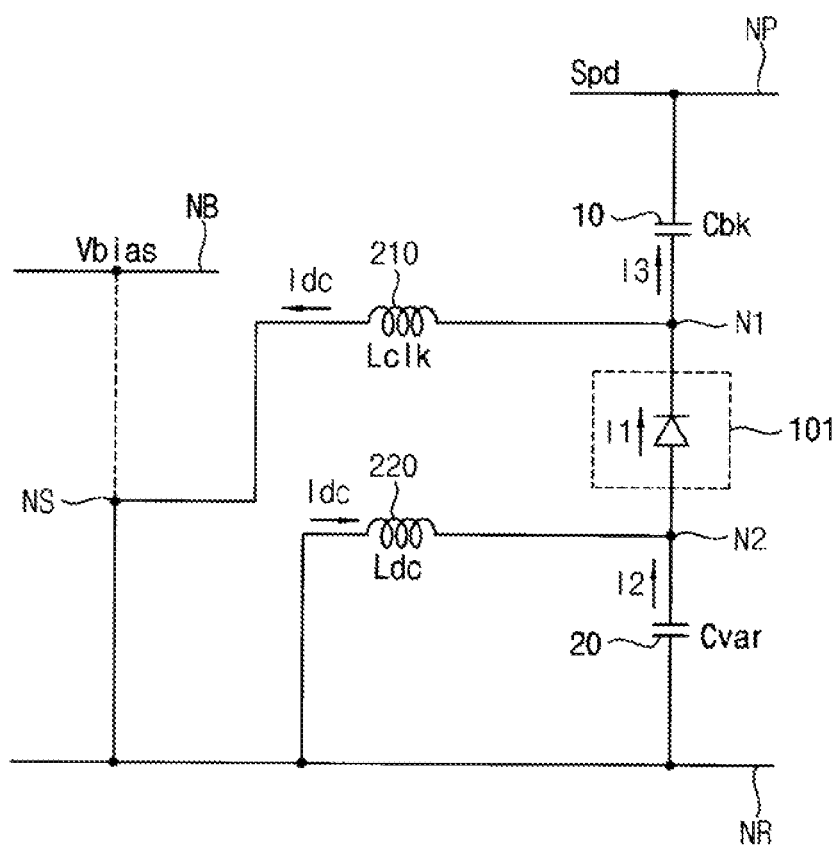
FIGS. 4A, 4B and 4C are diagrams for describing a first operation mode of the discrete capacitance switching circuit of FIG. 3 according to exemplary embodiments.
Figure 4B:
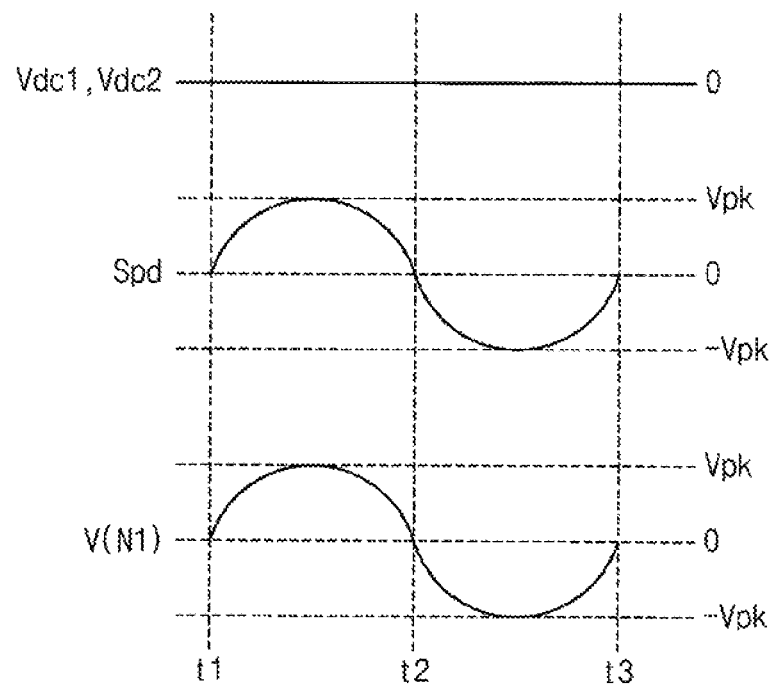
Figure 4C:
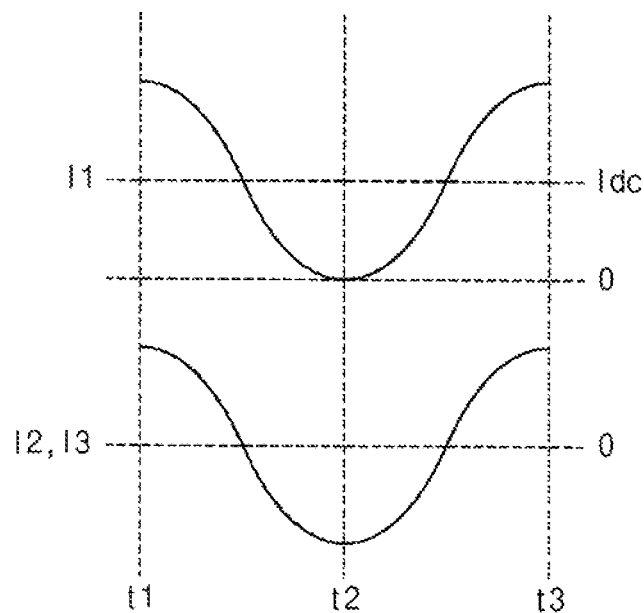

FIGS. 4A, 4B and 4C are diagrams for describing a first operation mode of the discrete capacitance switching circuit of FIG. 3 according to exemplary embodiments.

FIG. 4A illustrates a connection state of the discrete capacitance switching circuit 501 in the first operation mode according to exemplary embodiments. FIG. 4B illustrates waveforms of the voltages in the first operation mode according to exemplary embodiments. FIG. 4C illustrates waveforms of the currents in the first operation mode according to exemplary embodiments. For convenience of illustration, the waveforms corresponding to only one cycle of the AC signal Spd are shown in FIGS. 4B and 4C.

Referring to FIGS. 3, 4A, 4B and 4C, in the first operation mode, the first switch 230 may be turned on and the second switch 240 may be turned off to connect the switching node NS to the reference node NR to which the ground voltage is applied. For example, the ground voltage may be applied to the first node N1 through the chalk inductor 210 and the ground voltage may be applied to the second node N2 through the DC inductor 220.

As a result, the bias circuit 201 may apply the ground voltage as the first DC voltage Vdc1 to the first node N1 and apply the ground voltage as the second DC voltage Vdc2 to the second node N2 in the first operation mode while the diode 101 is turned on.

When the AC signal Spd is applied to the power node NP in the first operation mode, the same voltages are applied to the first node N1 and the power node NP because there are no DC components at both sides of the DC decoupling capacitor 10. For example, a voltage V(N1) at the first node N1 may have the same waveform as the AC signal Spd, which is a result compatible with a condition for a voltage-time valence of the chalk inductor 210 in a steady state, when the second node N2 corresponding to the one node of the chalk inductor 210 is grounded.

In an initial stage of applying the AC signal Spd, the diode 101 is turned on and the voltage V(N1) at the first node N1 is about equal to the voltage of the second node N2 during a period t2-t3 while the sinusoidal voltage applied to the first node N1 is negative.

During a period t1-t2 while the sinusoidal voltage applied to the first node N1 is positive in the initial stage, the diode 101 is turned off to block the current and the voltage of the second node N2 increases rapidly due to the current induced to the DC inductor 220 during the previous period. The voltage of the second node N2 increases until the voltage of the second node N2 becomes about equal to the first node N1. Subsequently, the diode 101 is turned on, and thus, the voltage V(N1) of the first node N1 becomes about equal to the voltage of the second node N2.

During the steady state after such a transitional initial state, a DC offset current Idc flows through the chalk inductor 210 and the DC inductor 220. As illustrated in FIG. 4C, a conduction current I1 through the diode 101, a charging-discharging current I2 of the unit capacitor 20, and a charging-discharging current I3 of the DC decoupling capacitor 10 oscillate even in the steady state.

The diode 101 may maintain the turned-on state due to the induced DC offset current Idc, which is a result compatible with a condition for a voltage-time valence of the DC inductor 220 in the steady state, when the reference node NR corresponding to the one node of the DC inductor 220 is grounded.

The first capacitance value C1 corresponding to an entire equivalent capacitance value of the discrete capacitance switching circuit 501 in the first operation mode while the diode 101 is turned on may be obtained as Expression 1, and the first capacitance value C1 may be Cvar because Cbk>>Cvar. In Expression 1, A//B represents a synthetic capacitance value when A and B are connected in series.

$$C1=(Cbk//Cvar)Cbk*Cvar/(Cbk+Cvar)=Cvar \quad \text{Expression 1}$$

Figure 5A:
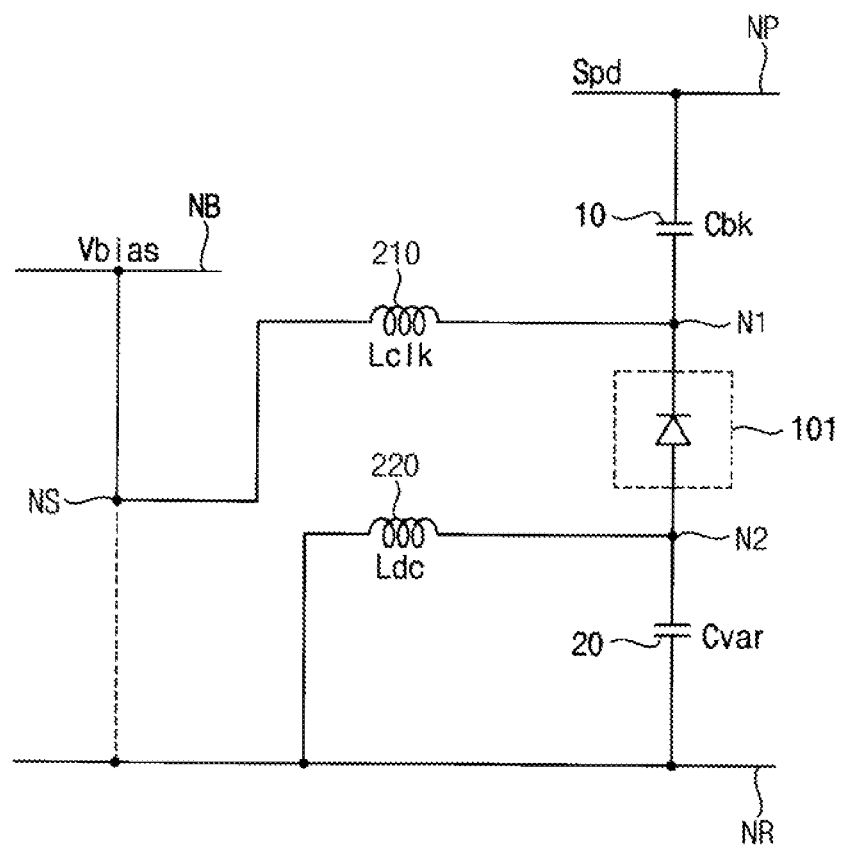
FIGS. 5A and 5B are diagrams for describing a second operation mode of the discrete capacitance switching circuit of FIG. 3 according to exemplary embodiments.
Figure 5B:
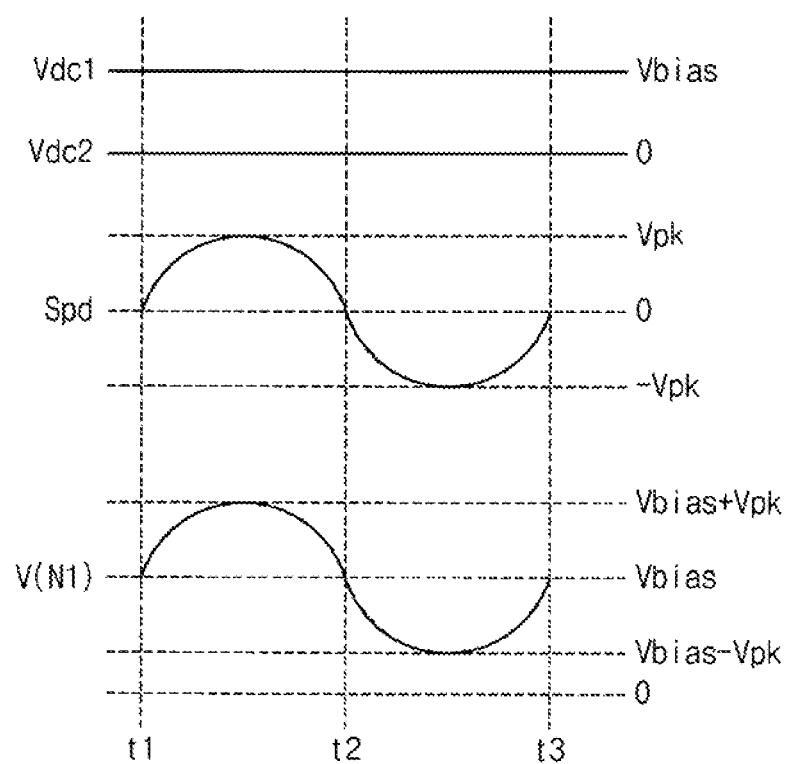

FIGS. 5A and 5B are diagrams for describing a second operation mode of the discrete capacitance switching circuit of FIG. 3 according to exemplary embodiments.

FIG. 5A illustrates a connection state of the discrete capacitance switching circuit 501 in the second operation mode according to exemplary embodiments. FIG. 5B illustrates waveforms of the voltages in the second operation mode according to exemplary embodiments. For convenience of illustration, the waveforms corresponding to only one cycle of the AC signal Spd are shown in FIG. 5B.

Referring to FIGS. 3, 5A and 5B, in the second operation mode, the first switch 230 may be turned off and the second switch 240 may be turned on to connect the switching node NS to the bias node NB to which the bias voltage Vbias is applied. For example, the bias voltage Vbias may be applied to the first node N1 through the chalk inductor 210 and the ground voltage may be applied to the second node N2 through the DC inductor 220.

As a result, the bias circuit 201 may apply the bias voltage Vbias as the first DC voltage Vdc1 to the first node N1 and apply the ground voltage as the second DC voltage Vdc2 to the second node N2 in the second operation mode while the diode 101 is turned off.

In the second operation mode, the bias voltage Vbias is applied to the switching node NS corresponding to the one node of the chalk inductor 210, and the chalk inductor 210 is in a shorted state in a DC condition. Thus, the voltage V(N1) at the first node N1 becomes a sum of the bias voltage Vbias and the voltage of the AC signal Spd, which is a result compatible with a condition for a voltage-time valence of the chalk inductor 210 in the steady state.

The bias voltage Vbias may be blocked by the DC decoupling capacitor 10. Thus, the bias voltage Vbias may not have an effect on the original waveform of the AC signal Spd at the power node NP. The other node of the DC inductor 220 maintains the grounded state, and the diode 101 cannot be turned on or a current cannot be induced to the DC inductor 220 if the voltage V(N1) maintains the positive level. The bias voltage Vbias may be set be about equal to or higher than the peak voltage Vpk of the AC signal Spd so that the voltage V(N1) may maintain the positive level.

The turned-off diode 101 may be modeled as the very small capacitance value Cpara due to the reverse bias, and almost of the voltage V(N1) may be applied to both sides of the diode 101.

A second capacitance value C2 corresponding to an entire equivalent capacitance value of the discrete capacitance switching circuit 501 in the second operation mode while the diode 101 is turned off may be obtained as Expression 2, and the second capacitance value C2 may be zero because Cbk>>Cvar>>Cpara and Cpara may be a very small value that is negligible.

$$C2=(Cbk//Cpara/Cvar)\approx(Cpara//Cvar)\approx Cpara\approx 0 \quad \text{Expression 2}$$

As a result, when the cathode electrode of the diode 101 is connected to the first node N1 and the anode electrode of the diode 101 is connected to the second node N2, the switching operation of the diode 101 may be controlled by changing the first DC voltage Vdc1 applied to the first node N1 from the ground voltage to the bias voltage Vbias, or from the bias voltage Vbias to the ground voltage.

The bias circuit 201 may turn off the diode 101 by applying the bias voltage Vbias as the first DC voltage Vdc1 to the first node N1 such that the bias voltage Vbias is about equal to or higher than the peak voltage Vpk of the AC signal Spd.

Figure 6:
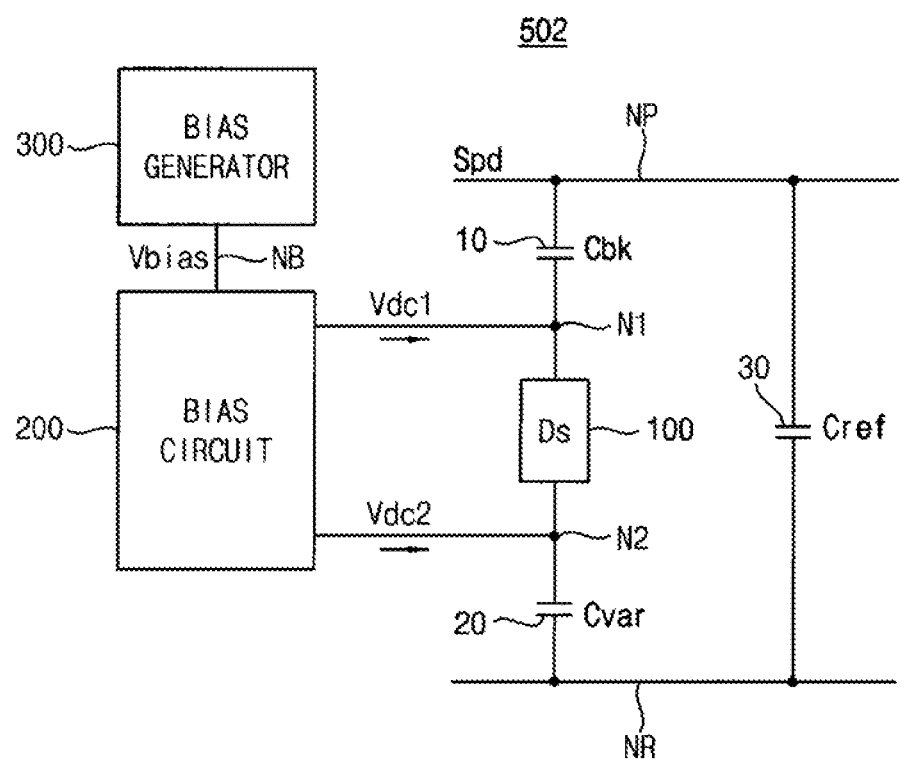
FIG. 6 is a diagram illustrating a discrete capacitance switching circuit according to exemplary embodiments.

FIG. 6 is a diagram illustrating a discrete capacitance switching circuit according to exemplary embodiments.

Referring to FIG. 6, in an exemplary embodiment, a discrete capacitance switching circuit 502 may include a DC decoupling capacitor 10, a diode Ds 100, a unit capacitor 20, a bias circuit 200, a reference capacitor 30, and a bias generator 300.

The DC decoupling capacitor 10 is connected between a power node NP that receives an AC signal Spd and a first node N1. The diode 100 is connected between the first node N1 and a second node N2. The unit capacitor 20 is connected between the second node N2 and a reference node NR that receives a ground voltage. The reference capacitor 30 is connected between the power node NP and the reference node NR.

The DC decoupling capacitor 10 may block a DC component of the AC signal Spd and pass an AC component of the AC signal Spd. Also, the DC decoupling capacitor 10 may reduce influences on the power node NP by the bias circuit 200. A bias voltage for a switching operation of the diode 100 may be lowered to a peak voltage of the AC signal Spd by blocking the DC component of the AC signal Spd using the DC decoupling capacitor 10. Thus, the discrete capacitance switching circuit 502 may improve the withstanding voltage problem of a semiconductor device operating at a high voltage.

The AC signal Spd may be a high-frequency signal such as, for example, an RF signal. As will be described below, when the discrete capacitance switching circuit 502 is used for impedance matching of a plasma processing system, the AC signal Spd may be a plasma driving signal. The AC signal Spd may be an oscillating signal centered on a certain DC voltage such as, for example, a ground voltage. The ground voltage may be applied to the reference node NR as a DC voltage and the ground voltage may be 0 V.

The bias circuit 200 may apply a first DC voltage Vdc1 to the first node N1 and apply a second DC voltage Vdc2 to the second node N2 to control a switching operation of the diode 100 (e.g., to turn the diode 100 on and off).

In exemplary embodiments, as described with reference to FIG. 3, a cathode electrode of the diode 100 may be connected to the first node N1 and an anode electrode of the diode 100 may be connected to the second node N2. In this case, the switching operation of the diode 100 may be controlled by changing the first DC voltage Vdc1 applied to the first node N1. The switching operation of the reverse-connected diode is the same as described above with reference to FIGS. 3 through 5B.

Depending on the switching operation of the diode 100, different capacitance values may be applied to the power node NP. For example, as described above with reference to FIGS. 4A through 5B, a first capacitance value may be provided to the power node NP in a first operation mode while the diode 100 is turned on, and a second capacitance value lower than the first capacitance value may be provided to the power node NP in a second operation mode while the diode 100 is turned off.

A capacitance value Cbk of the DC decoupling capacitor 10 may be set to be sufficiently higher than a capacitance value Cvar of the unit capacitor 20. For example, the DC decoupling capacitor 10 may have a capacitance value Cbk capable of implementing a cutoff frequency that is lower than about 1/10 frequency of the AC signal Spd, and the DC decoupling capacitor 10 may be implemented with a non-polar capacitor.

When the capacitance value Cbk of the DC decoupling capacitor 10 is sufficiently higher than the capacitance value Cvar of the unit capacitor 20, the first capacitance value in the first operation mode while the diode 100 is turned on may converge to the capacitance value Cvar of the unit capacitor 20. In the second operation mode while the diode 100 is turned off, the diode 100 may be considered as a capacitor having a very small parasitic capacitance value, and thus, the second capacitance value may converge to zero. As a result, the capacitance value Cvar of the unit capacitor 20 may be a changing unit of the capacitance value of the discrete capacitance switching circuit 502.

In conventional circuits, it may be difficult to implement a sufficiently small capacitance value due to, for example, the withstanding voltage problem of a semiconductor device, a high capacitance value of a turned-off transistor, etc. In contrast, the discrete capacitance switching circuit 502 according to exemplary embodiments may reduce the capacitance value Cvar of the unit capacitor 20 down to a few pF by blocking the DC component using the DC decoupling capacitor 10 and performing the switching operation using the diode 100 having a small turn-off capacitance value.

A first capacitance value C1' corresponding to an entire equivalent capacitance value of the discrete capacitance switching circuit 502 in the first operation mode while the diode 100 is turned on may be obtained as Expression 3, and the first capacitance value C1' may be Cref+Cvar where Cref is a capacitance value of the reference capacitor 30, because Cbk>>Cvar.

$$C1' = Cref + C1 = Cref + (Cbk // Cvar) \approx Cref + Cvar \quad \text{Expression 3}$$

A second capacitance value C2' corresponding to an entire equivalent capacitance value of the discrete capacitance switching circuit 502 in the second operation mode while the diode 100 is turned off may be obtained as Expression 4 using the capacitance value C2 of Expression 2. The second capacitance value C2' may be Cref because Cbk Cvar Cpara and Cpara may be a very small value that is negligible.

$$C2' = Cref + C2 = Cref + (Cbk // Cpara // Cvar) \approx Cref + Cpara \approx Cref \quad \text{Expression 4}$$

The bias generator 300 may generate the bias voltage Vbias, which is about equal to or higher than the peak voltage Vpk of the AC signal Spd, and may provide the bias voltage Vbias to the bias circuit 200. As described above with reference to FIG. 3, the bias voltage Vbias may be applied to the bias node NB of the voltage selection circuit 251 included in the bias circuit 200. According to exemplary embodiments, the bias generator 300 may receive a DC power and/or an AC power to generate a plurality of DC voltages, and select one of the plurality of DC voltages depending on operational conditions to provide the selected DC voltage as the bias voltage Vbias.

In an exemplary embodiment, a total capacitance value of the unit capacitor 20 and the reference capacitor 30 is applied to the power node NP in a first operation mode while the diode 100 is turned on, and a capacitance value of the reference capacitor 30 is applied to the power node NP in a second operation mode while the diode 100 is turned off.

FIGS. 7A through 9B are diagrams illustrating exemplary embodiments of a voltage selection circuit included in a discrete capacitance switching circuit according to exemplary embodiments.

Figure 7A:
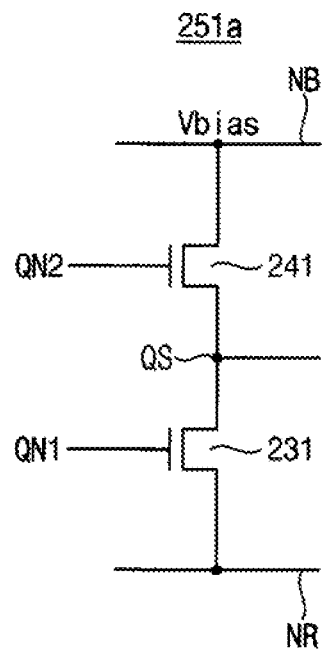
FIGS. 7A through 9B are diagrams illustrating exemplary embodiments of a voltage selection circuit included in a discrete capacitance switching circuit according to exemplary embodiments.

Referring to FIG. 7A, in an exemplary embodiment, a voltage selection circuit 251a may include a first N-type metal oxide semiconductor (NMOS) transistor 231 and a second NMOS transistor 241.

The first NMOS transistor 231 may be connected between a switching node QS (e.g., the above-described switching node NS) and the reference node NR to which the ground voltage is applied, and may perform a switching operation in response to a first N-type switch signal QN1.

The second NMOS transistor 241 may be connected between the switching node QS and the bias node NB to which the bias voltage Vbias is applied, and may perform a switching operation in response to a second N-type switch signal QN2.

Figure 7B:
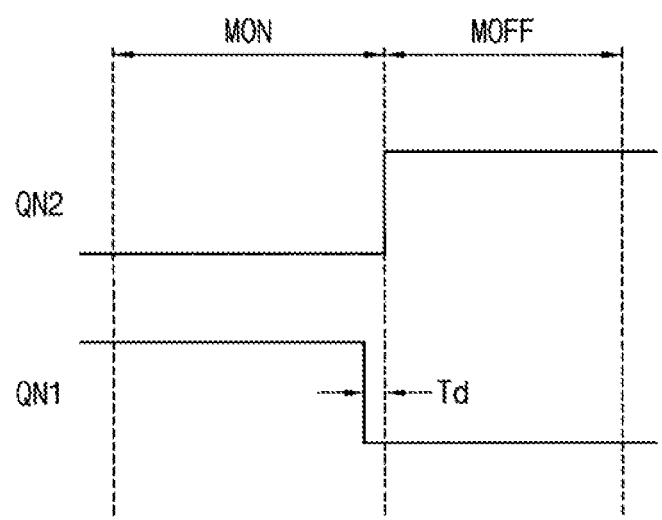

As illustrated in FIG. 7B, the first N-type switch signal QN1 and the second N-type switch signal QN2 may be activated complementarily. The first N-type switch signal QN1 may be activated at a logic high level and the second N-type switch signal QN2 may be deactivated at a logic low level in the first operation mode MON while the diode 101 of FIG. 3 is turned on. In contrast, the first N-type switch signal QN1 may be deactivated at the logic low level and the second N-type switch signal QN2 may be activated at the logic high level in the second operation mode MOFF while the diode 101 is turned off.

As a result, in an exemplary embodiment, only the first NMOS transistor 231 is turned on in the first operation mode MON such that the ground voltage is applied to the switching node QS, and only the second NMOS transistor 241 is turned on in the second operation mode MOFF such that the bias voltage Vbias is applied to the switching node QS.

In exemplary embodiments, as illustrated in FIG. 7B, the second N-type switch signal QN2 may be activated with a time interval Td after the first N-type switch signal QN1 is deactivated, so as to prevent short power consumption due to simultaneous turn-on of the first NMOS transistor 231 and the second N-type transistor 241.

Figure 8A:
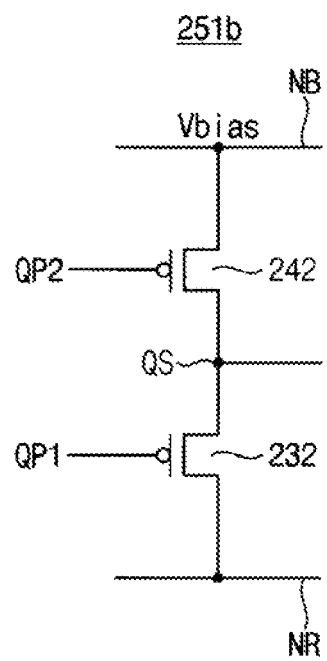

Referring to FIG. 8A, in an exemplary embodiment, a voltage selection circuit 251b may include a first P-type metal oxide semiconductor (PMOS) transistor 232 and a second PMOS transistor 242.

The first PMOS transistor 232 may be connected between the switching node QS and the reference node NR to which the ground voltage is applied, and may perform a switching operation in response to a first P-type switch signal QP1.

The second PMOS transistor 242 may be connected between the switching node QS and the bias node NB to which the bias voltage Vbias is applied, and may perform a switching operation in response to a second P-type switch signal QP2.

Figure 8B:
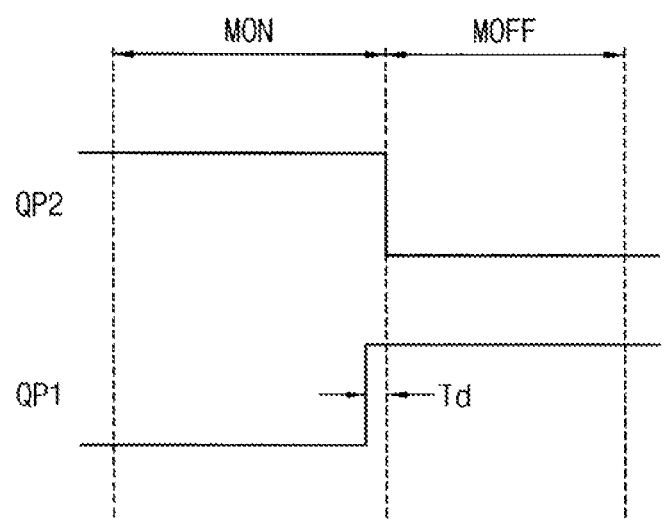

As illustrated in FIG. 8B, the first P-type switch signal QP1 and the second P-type switch signal QP2 may be activated complementarily. The first P-type switch signal QP1 may be activated at a logic low level and the second P-type switch signal QP2 may be deactivated at a logic high level in the first operation mode MON while the diode 101 of FIG. 3 is turned on. In contrast, the first P-type switch signal QP1 may be deactivated at the logic high level and the second P-type switch signal QP2 may be activated at the logic low level in the second operation mode MOFF while the diode 101 is turned off.

As a result, in an exemplary embodiment, only the first PMOS transistor 232 is turned on in the first operation mode MON such that the ground voltage is applied to the switching node QS, and only the second PMOS transistor 242 is turned on in the second operation mode MOFF such that the bias voltage Vbias is applied to the switching node QS.

In exemplary embodiments, as illustrated in FIG. 8B, the second P-type switch signal QP2 may be activated with a time interval Td after the first P-type switch signal QP1 is deactivated, so as to prevent short power consumption due to simultaneous turn-on of the first PMOS transistor 232 and the second P-type transistor 242.

Figure 9A:
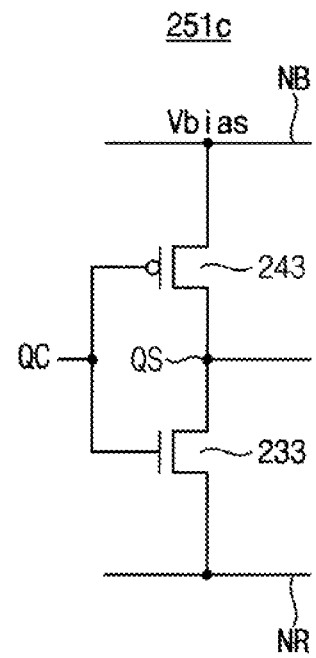

Referring to FIG. 9A, in an exemplary embodiment, a voltage selection circuit 251c may include an NMOS transistor 233 and a PMOS transistor 243.

The NMOS transistor 233 may be connected between the switching node QS and the reference node NR to which the ground voltage is applied, and may perform a switching operation in response to a common switch signal QC.

The PMOS transistor 243 may be connected between the switching node QS and the bias node NB to which the bias voltage Vbias is applied, and may perform a switching operation in response to the common switch signal QC.

Figure 9B:
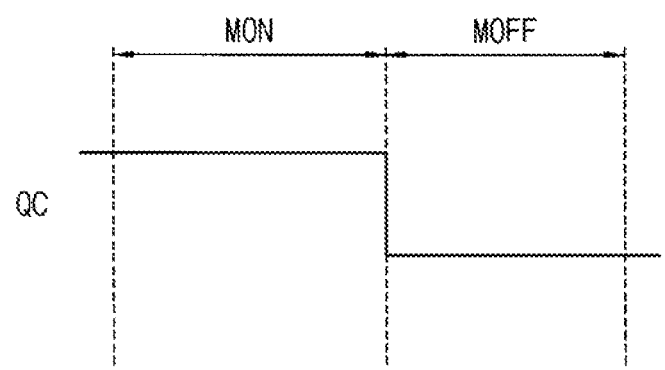

As illustrated in FIG. 9B, the common switch signal QC may have a logic high level in the first operation mode MON while the diode 101 of FIG. 3 is turned on, and a logic low level in the second operation mode MOFF while the diode 101 is turned off.

As a result, in an exemplary embodiment, only the NMOS transistor 233 is turned on in the first operation mode MON such that the ground voltage is applied to the switching node QS, and only the PMOS transistor 243 is turned on in the second operation mode MOFF such that the bias voltage Vbias is applied to the switching node QS.

Figure 10:
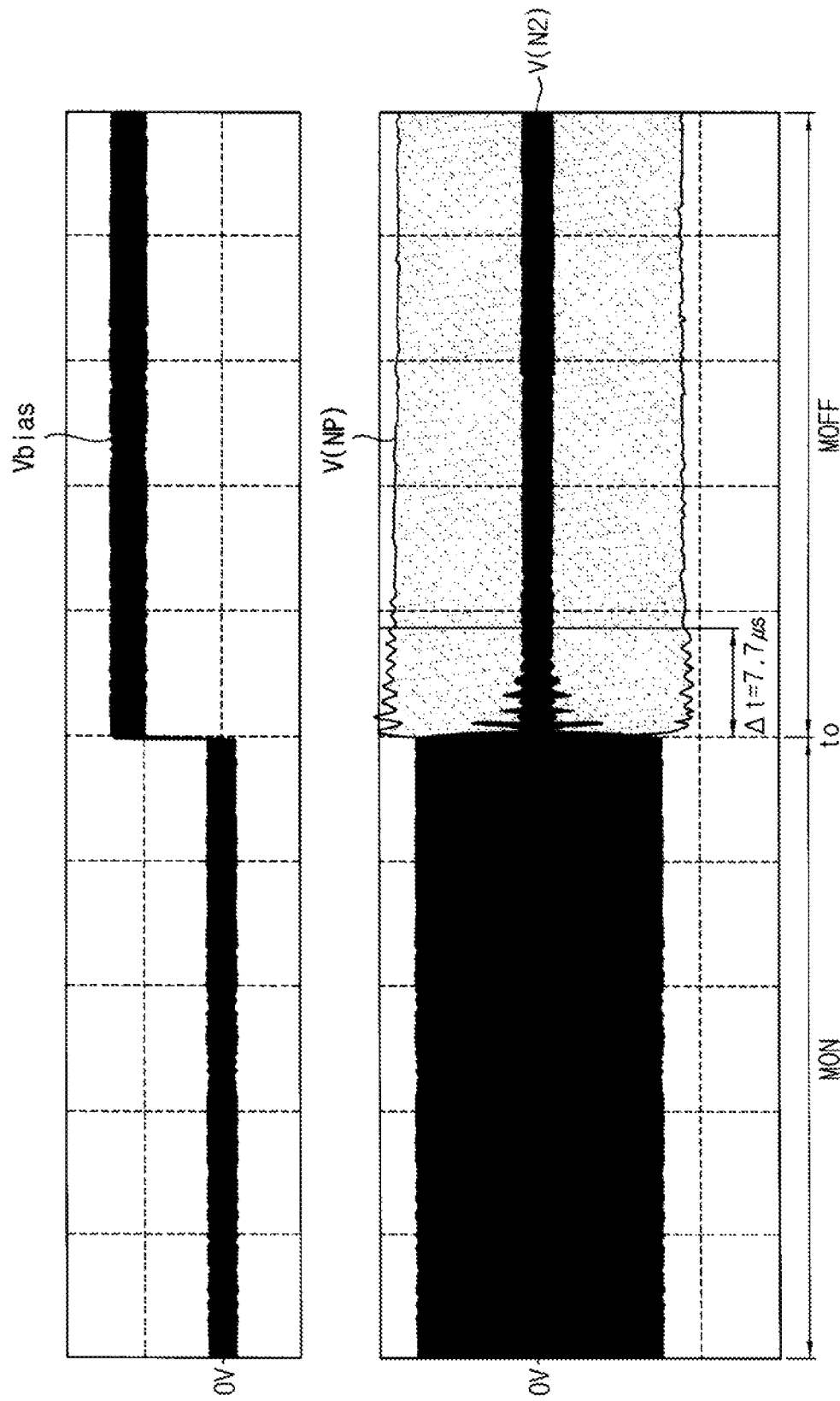
FIG. 10 is a waveform diagram illustrating an operation of the discrete capacitance switching circuit of FIG. 3 according to exemplary embodiments.

FIG. 10 is a waveform diagram illustrating an operation of the discrete capacitance switching circuit of FIG. 3 according to exemplary embodiments.

FIG. 10 illustrates a mode transition from the first operation mode MON while the diode 101 of FIG. 3 is turned on to the second operation mode MOFF while the diode 101 is turned off. For example, FIG. 10 illustrates a case in which the first switch 230 of FIG. 3 is turned off and the second switch 240 is turned on at a mode transition time point t0.

In FIG. 10, the vertical axis represents a voltage in units of 200 V and the horizontal axis represents an elapsed time in units of 10 us. FIG. 10 represents a simulation result when the AC signal Spd having a high frequency of 13.56 MHz is applied to the power node NP.

In the first operation mode MON, there is no DC component at both sides of the DC decoupling capacitor 10, and the voltage V(NP) of the power node NP is applied as it is as the voltage V(N2) of the second node N2 as described with reference to FIGS. 4A, 4B and 4C.

In the second operation mode MOFF, the diode 101 is turned off by the bias voltage Vbias, and the voltage V(N2) of the second node N2 decreases to a very small level as described with reference to FIGS. 5A and 5B. A small amount of time is required for the DC offset current Idc induced to the inductor to converge zero. This amount of time may be less than about 10 us (e.g., about 7.7 us in an exemplary embodiment), which is very short in comparison with the time required in conventional circuits.

Figure 11:
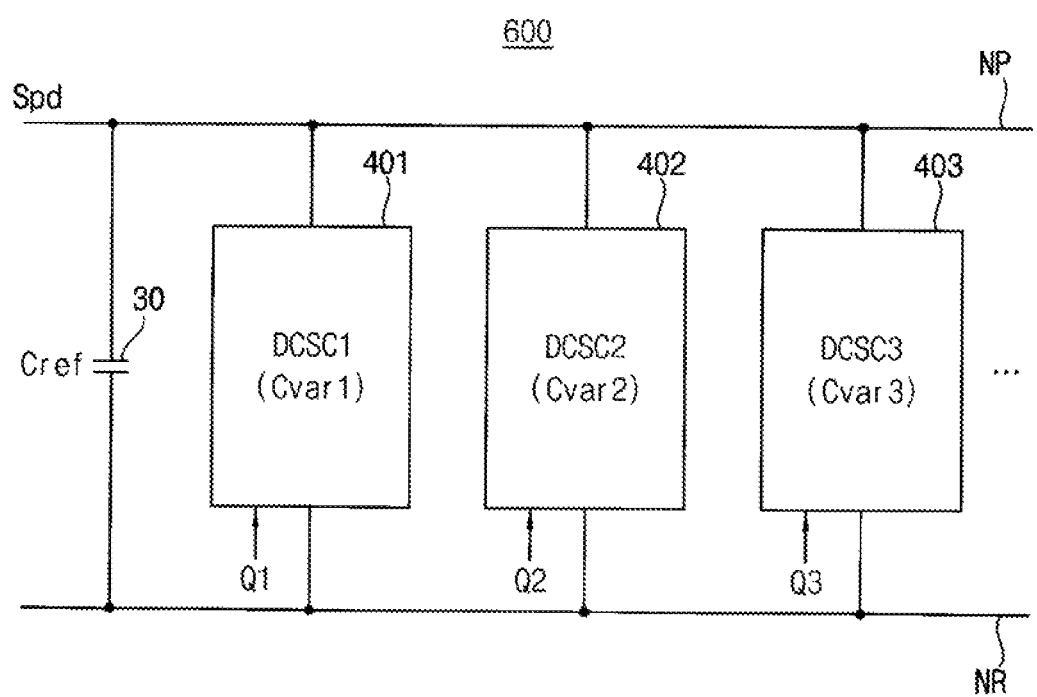
FIG. 11 is a diagram illustrating a capacitor array circuit according to exemplary embodiments.

FIG. 11 is a diagram illustrating a capacitor array circuit according to exemplary embodiments.

Referring to FIG. 11, in an exemplary embodiment, a capacitor array circuit 600 may include a reference capacitor 30 and a plurality of discrete capacitance switching circuits DCSC1 401, DCSC2 402 and DCSC3 403.

The reference capacitor 30 is connected between a power node NP that receives an alternating current (AC) signal Spd and a reference node NR that receives a ground voltage. The plurality of discrete capacitance switching circuits 401, 402 and 403 is connected in parallel between the power node NP and the reference node NR.

Each of the plurality of discrete capacitance switching circuits 401, 402 and 403 may include, as described above, a direct current (DC) decoupling capacitor connected between the power node and a first node, a diode connected between the first node and a second node, a unit capacitor connected between the second node and the reference node, and a bias circuit configured to apply a first DC voltage to the first node and apply a second DC voltage to the second node to control a switching operation of the diode.

With respect to each of the discrete capacitance switching circuits 401, 402 and 403, as described above, a first capacitance value is provided to the power node in a first operation mode while the diode is turned on, and a second capacitance value lower than the first capacitance value is provided to the power node in a second operation mode while the diode is turned off.

Each of the discrete capacitance switching circuits 401, 402 and 403 may be set in response to each of switch signals Q1, Q2 and Q3 to one of the first operation mode MON and the second operation mode MOFF, as described above. A bias generator as described above may be commonly assigned to the discrete capacitance switching circuits 401, 402 and 403, or a plurality of bias generators may be assigned to the discrete capacitance switching circuits 401, 402 and 403, respectively.

In exemplary embodiments, a plurality of unit capacitors respectively included in the plurality of discrete capacitance switching circuits 401, 402 and 403 may have the same capacitance value.

In exemplary embodiments, the plurality of unit capacitors respectively included in the plurality of discrete capacitance switching circuits 401, 402 and 403 may have different capacitance values Cvar1, Cvar2 and Cvar3. For example, the capacitance values Cvar1, Cvar2 and Cvar3 may increase arithmetically such as C, 2C and 3C, or increase exponentially such as C, 2C and 4C.

The entire capacitance value provided to the power node NP may be changed rapidly and accurately using the plurality of discrete capacitance switching circuits 401, 402 and 403.

Figure 12:
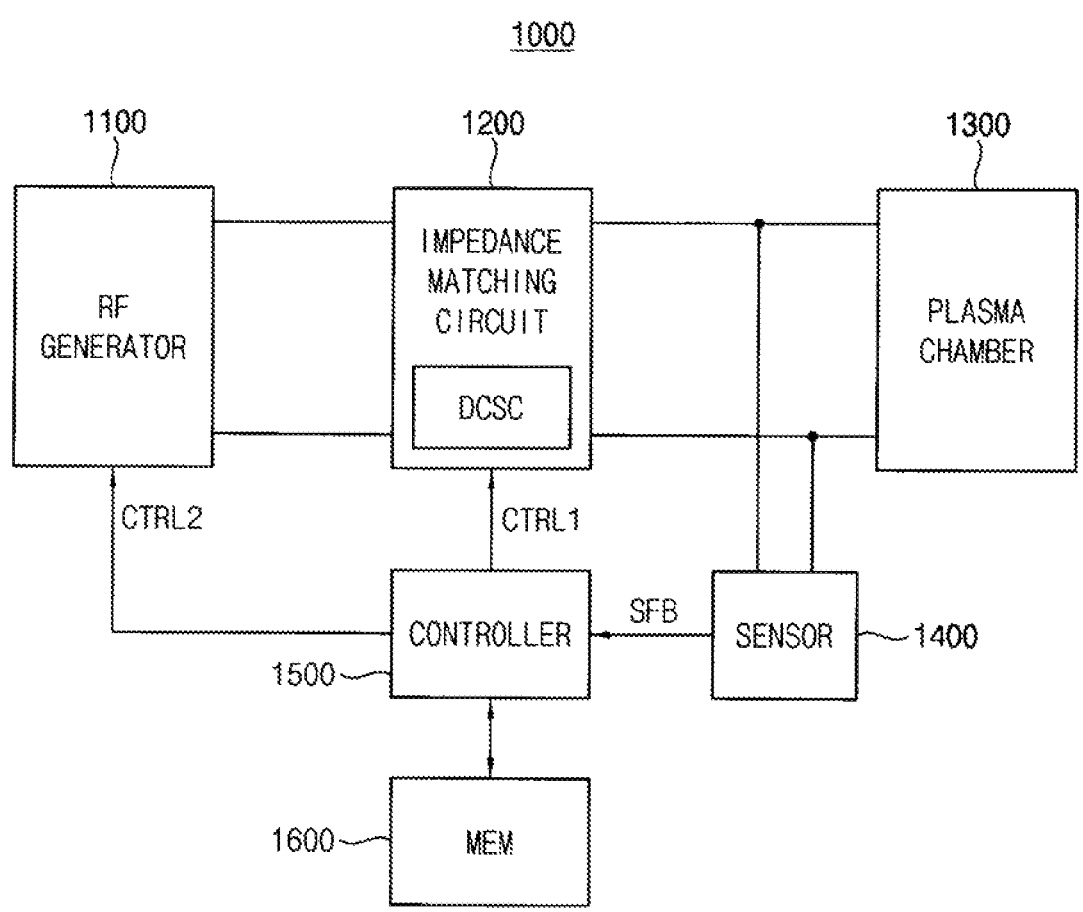
FIG. 12 is a block diagram illustrating a plasma processing system according to exemplary embodiments.

FIG. 12 is a block diagram illustrating a plasma processing system according to exemplary embodiments.

Referring to FIG. 12, in an exemplary embodiment, a plasma processing system 1000 may include an RF generator 1100, an impedance matching circuit 1200, a plasma chamber 1300, a sensor 1400, a controller 1500, and a memory device MEM 1600.

The sensor 1400 may sense a power supplied to the plasma chamber 1300 and may provide a feedback signal SFB. For example, the controller 1500 may measure a reflection wave at an input node of the plasma chamber 1300 and generate the feedback signal SFB indicating the degree of impedance matching.

The controller 1500 may generate a control signal CTRL1 to control the impedance matching circuit 1200, and a control signal CTR2 to control the RF generator 1100 based on the feedback signal SFB. The above-described switch signals QN1, QN2, QP1, QP2, QC, Q1, Q2 and Q3 may be included in the control signal CTRL1 generated by the controller 1500. For each unit process performed in the plasma chamber 1300, scanning of an optimal capacitance value may be performed as will be described below. The information obtained through scanning of the optimal capacitance value may be stored in the memory device 1600, and the stored information may be used to improve the processes of the plasma chamber 1300.

The plasma processing system 1000 uses plasma for processes such as, for example, etching, chemical vapor deposition (CVD), etc. The plasma processing system 1000 may include various structural components and electronic components to generate the plasma. For example, in an exemplary embodiment, the plasma processing system 1000 includes the RF generator 1100 and the impedance matching circuit 1200 for supplying power used to generate the plasma. For example, the impedance matching circuit 1200 is configured to match load impedance to transfer the RF power without loss from the RF generator 1100 to the plasma chamber 1300.

The plasma may be generated by injecting gases into a vacuum chamber (e.g., the plasma chamber 1300) and applying the RF energy to the gases in the plasma chamber 1300. The impedance of the plasma chamber 1300 may be varied depending on various factors such as, for example, gas species, gas flow amount, pressure, RF energy, etc. Thus, impedance matching is utilized for efficient power transfer from the RF generator 1100 to the plasma chamber 1300. Since a system impedance of the RF generator 1100 is generally fixed to a predetermined value (e.g., about 50Ω), the impedance matching circuit 1200 may adjust an equivalent load imposed on the RF generator 1100.

The impedance matching circuit 1200 may be implemented as a serial and/or parallel combination of inductors and resistors. For example, in an exemplary embodiment, the entire impedance may be adjusted using a variable capacitor so as to cope with the varying load impedance. An RF energy of hundreds to thousands of watts is used to generate the plasma. Due to the high amount power, a vacuum variable capacitor (VVC) may be utilized.

The VVC is a mechanical-variable capacitor including two coaxial metal rings such that the capacitance value of the VVC may be varied by adjusting a distance between the metal rings. Thus, the VVC has good voltage/current characteristics. However, such a mechanical-variable capacitor may use a long time for impedance matching, and the generated plasma may be unstable.

The semiconductor process includes a plurality of unit processes, and the factors such as, for example, gas species, gas flow, pressure and RF energy are controlled in each unit process. The time of each unit process is shortened and the number of the unit processes is increased as the design rule of the semiconductor process is reduced.

Recently, the unit processes of a few seconds are increasing. The impedance matching network using the conventional VVC may need about one or two seconds for changing the mechanical structure. As a result, reduction of the time of the unit process is limited because of the plasma fluctuation during the change effect on the result of the plasma processing.

To reduce the time for changing the impedance, the impedance matching circuit 1200 according to exemplary embodiments may include at least one discrete capacitance switching circuit as described above. In exemplary embodiments, the impedance matching circuit 1200 may include a plurality of discrete capacitance switching circuits having the same unit capacitance value or different capacitance values as described above with reference to FIG. 11.

The manufacturing time of the semiconductor circuit may be reduced and productivity may be improved by implementing the plasma processing system 1000 using the discrete capacitance switching circuit and/or the capacitor array circuit according to exemplary embodiments.

Figure 13A:
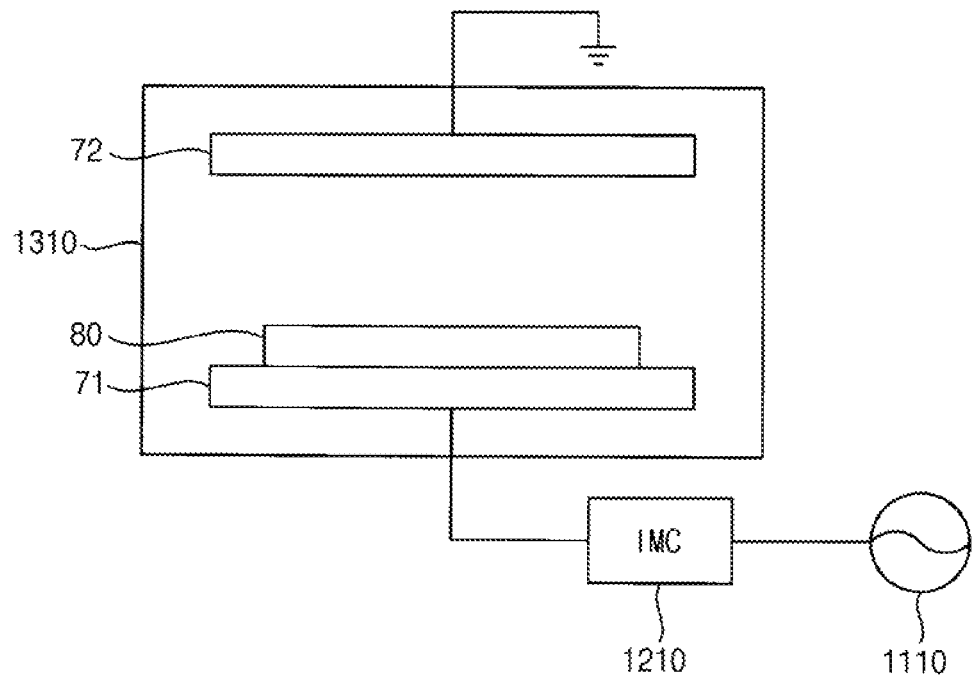
FIGS. 13A, 13B and 13C are diagrams illustrating exemplary configurations of a plasma chamber.
Figure 13B:
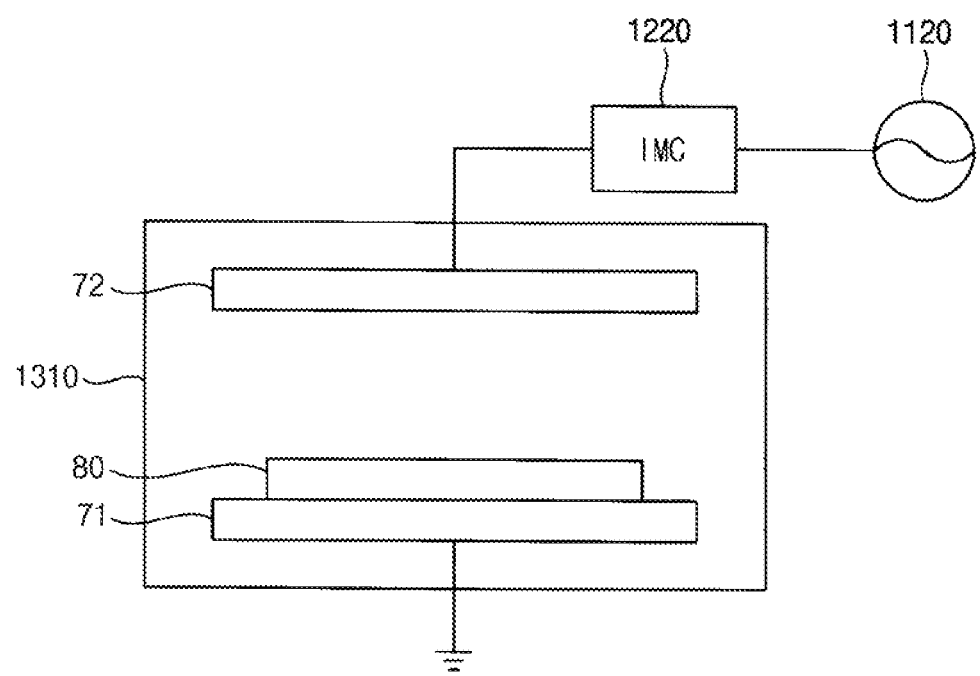
Figure 13C:
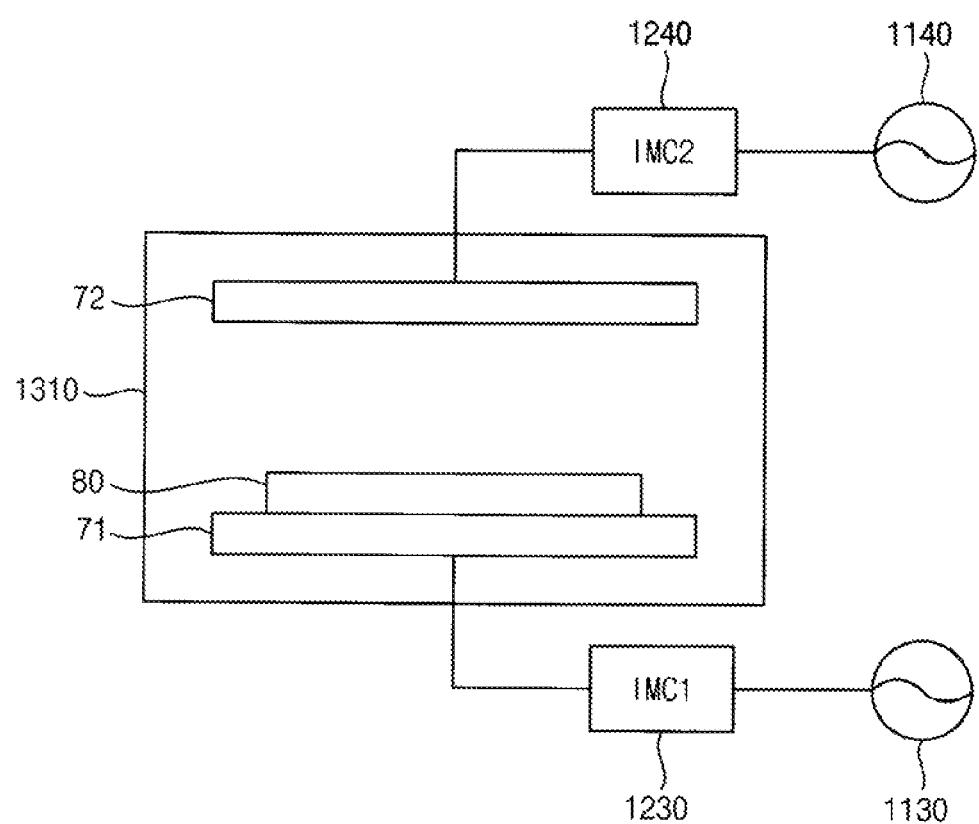

FIGS. 13A, 13B and 13C are diagrams illustrating exemplary configurations of a plasma chamber.

Referring to FIGS. 13A, 13B and 13C, in an exemplary embodiment, a plasma chamber 1310 includes a lower electrode 71 and an upper electrode 72. A substrate to be processed may be mounted on a substrate support including the lower electrode 71. The plasma may be generated by applying at least one plasma driving signal to at least one of the lower electrode 71 and the upper electrode 72.

In exemplary embodiments, as illustrated in FIG. 13A, a plasma driving signal may be applied to the lower electrode 71 using an RF generator 1110 and an impedance matching circuit 1210, and the ground voltage may be applied to the upper electrode 72.

In exemplary embodiments, as illustrated in FIG. 13B, a plasma driving signal may be applied to the upper electrode 72 using an RF generator 1120 and an impedance matching circuit 1220, and the ground voltage may be applied to the upper electrode 72.

In exemplary embodiments, as illustrated in FIG. 13C, two plasma driving signals may be applied to the lower electrode 71 and the upper electrode 72 using two RF generators 1130 and 1140 and two impedance matching circuits 1230 and 1240, respectively.

Figure 14:
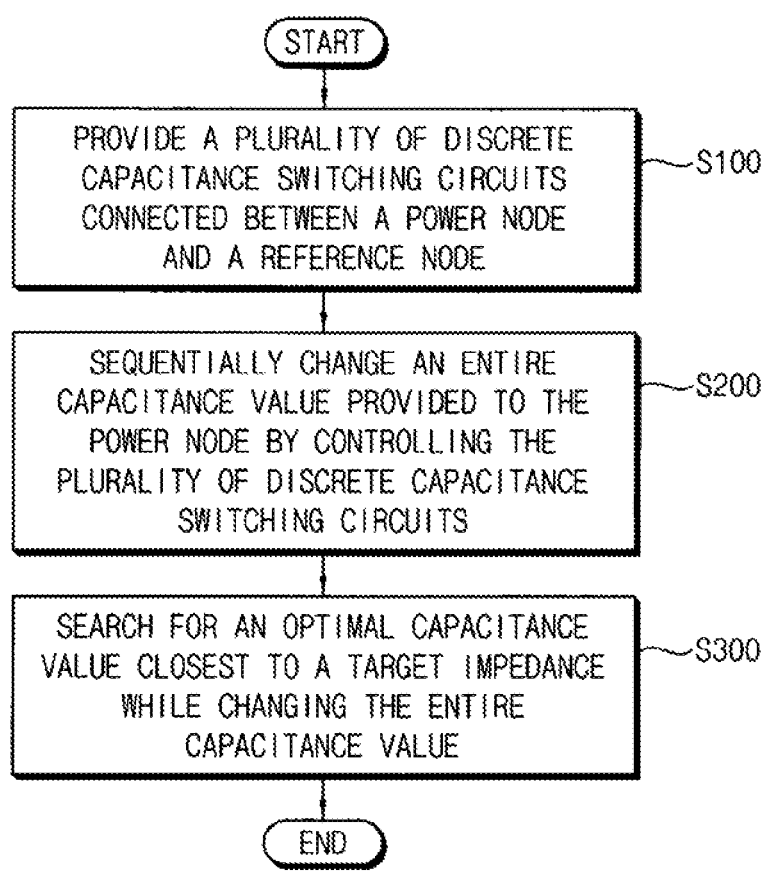
FIG. 14 is a flowchart illustrating a method of impedance matching according to exemplary embodiments.

FIG. 14 is a flowchart illustrating a method of impedance matching according to exemplary embodiments.

Referring to FIG. 14, in an exemplary embodiment, a plurality of discrete capacitance switching circuits connected between a power node and a reference node may be provided (S100).

Each of the plurality of discrete capacitance switching circuits may include, as described above, a DC decoupling capacitor connected between the power node and a first node, a diode connected between the first node and a second node, a unit capacitor connected between the second node and the reference node, and a bias circuit configured to apply a first DC voltage to the first node and apply a second DC voltage to the second node to control a switching operation of the diode.

A first capacitance value may be provided to the power node in the first operation mode while the diode is turned on, and a second capacitance value lower than the first capacitance value may be provided to the power node in the second operation mode while the diode is turned off.

An entire capacitance value provided to the power node may be changed sequentially by controlling the plurality of discrete capacitance switching circuits (S200).

As described above with reference to FIG. 11, the change of the entire capacitance value may be implemented by sequentially activating or deactivating the switching signals Q1, Q2 and Q3 for setting each of the discrete capacitance switching circuits 401, 402 and 403 to one of the first operation mode MON and the second operation mode MOFF.

An optimal capacitance value closest to a target impedance is searched for while changing the entire capacitance value (S300).

The determination of the optimal capacitance value may be performed based on the feedback signal SFB provided from the sensor 1400 as described above with reference to FIG. 12.

Figure 15A:
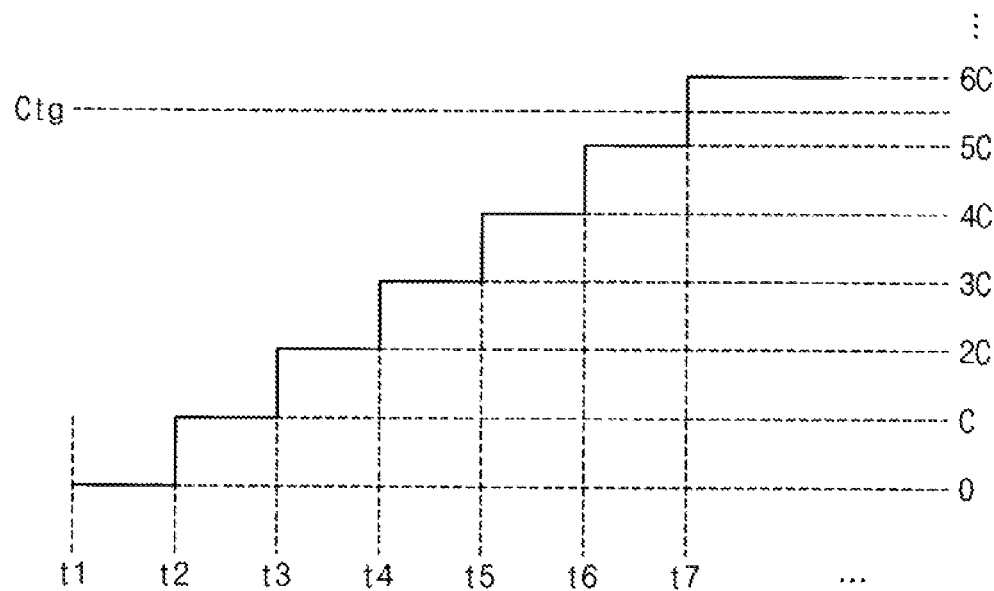
FIGS. 15A, 15B and 15C are diagrams for describing examples of scanning an optimal capacitance value for a method of impedance matching according to exemplary embodiments.
Figure 15B:
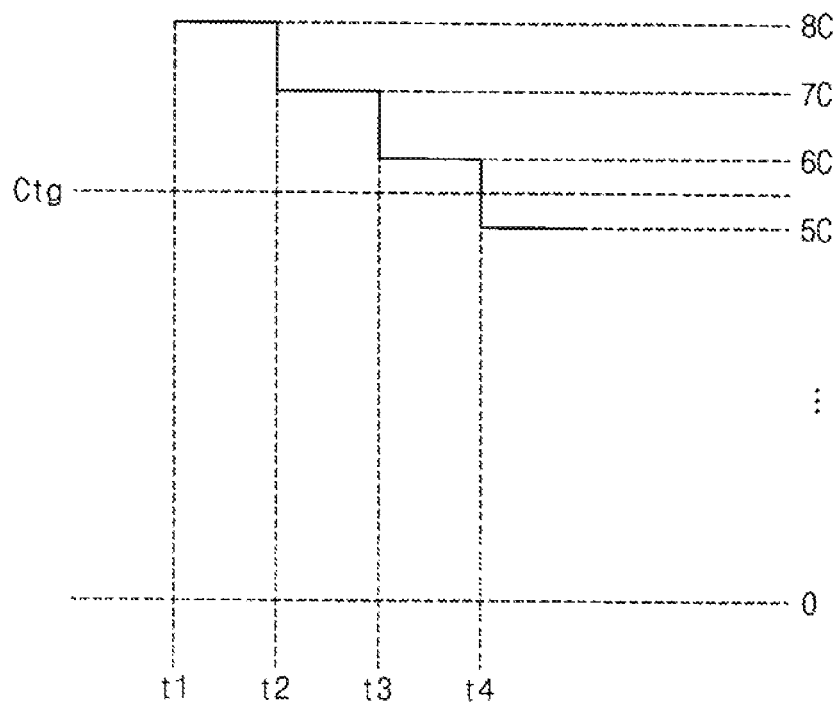
Figure 15C:
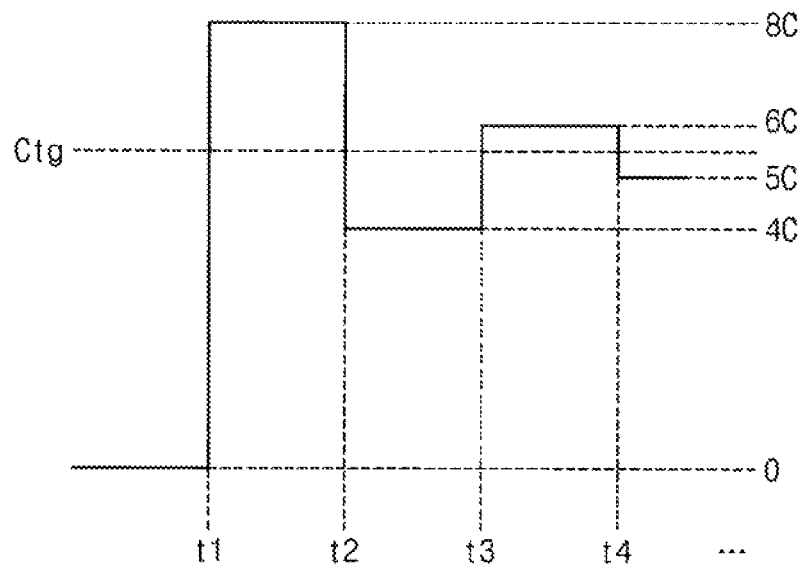

FIGS. 15A, 15B and 15C are diagrams for describing examples of scanning an optimal capacitance value for a method of impedance matching according to exemplary embodiments.

Referring to FIGS. 15A, 15B and 15C, the entire capacitance value provided to the power node may be changed sequentially at time points t1-t7 for searching the target capacitance value Ctg. As described above, the sequential change of the entire capacitance value may be performed by controlling the plurality of discrete capacitance switching circuits connected to the power node.

In exemplary embodiments, a plurality of unit capacitors respectively included in the plurality of discrete capacitance switching circuits may have the same capacitance value. In this case, the entire capacitance value may be increased sequentially by a minimum unit value C, as illustrated in FIG. 15A, by sequentially converting the plurality of discrete capacitance switching circuits one by one from the second operation mode to the first operation mode. In contrast, the entire capacitance value may be decreased sequentially by the minimum unit value C, as illustrated in FIG. 15B, by sequentially converting the plurality of discrete capacitance switching circuits one by one from the first operation mode to the second operation mode.

In exemplary embodiments, a plurality of unit capacitors respectively included in the plurality of discrete capacitance switching circuits have different capacitance values. In this case, the optimal capacitance value closest to the target capacitance value Ctg may be searched for by determining the operation mode of the discrete capacitance switching circuit having the greatest unit capacitance value, then determining the operation mode of the discrete capacitance switching circuit having the second greatest unit capacitance value, and repeating this process, as illustrated in FIG. 15C.

As described above, the discrete capacitance switching circuit according to exemplary embodiments may improve performance and reliability of a semiconductor circuit including the discrete capacitance switching circuit by changing the capacitance value rapidly and accurately. The manufacturing time of the semiconductor circuit may be reduced by implementing a plasma processing system using the discrete capacitance switching circuit and/or the capacitor array circuit. In addition, the discrete capacitance switching circuit and the capacitor array circuit according to exemplary embodiments may improve the withstanding voltage problem of a semiconductor device operating at a high voltage.

Exemplary embodiments of the present inventive concept may be applied to any semiconductor device and manufacturing processes of a semiconductor device. For example, exemplary embodiments of the inventive concept may be applied to systems such as a memory card, a solid state drive (SSD), an embedded multimedia card (eMMC), a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of Things (IoT) device, an Internet of Everything (IoE) device, an e-book, a virtual reality (VR) device, an augmented reality (AR) device, etc., and manufacturing processes thereof.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A discrete capacitance switching circuit, comprising:
   a direct current (DC) decoupling capacitor connected between a power node that receives an alternating current (AC) signal and a first node;
   a diode connected between the first node and a second node;
   a unit capacitor connected between the second node and a reference node that receives a ground voltage; and
   a bias circuit configured to apply a first DC voltage to the first node and apply a second DC voltage to the second node, wherein the first DC voltage and the second DC voltage control a switching operation of the diode.

2. The discrete capacitance switching circuit of claim 1, wherein a first capacitance value is applied to the power node in a first operation mode while the diode is turned on, and a second capacitance value lower than the first capacitance value is applied to the power node in a second operation mode while the diode is turned off.

3. The discrete capacitance switching circuit of claim 1, wherein a cathode electrode of the diode is connected to the first node and an anode electrode of the diode is connected to the second node.

4. The discrete capacitance switching circuit of claim 3, wherein a switching operation of the diode is controlled by changing the first DC voltage applied to the first node.

5. The discrete capacitance switching circuit of claim 3, wherein the bias circuit applies a bias voltage as the first DC voltage to the first node, wherein the diode is turned off in response to the bias circuit applying the bias voltage as the first DC voltage to the first node, and the bias voltage is about equal to or greater than a peak voltage of the AC signal.

6. The discrete capacitance switching circuit of claim 3, wherein the bias circuit applies the ground voltage as the first DC voltage to the first node in a first operation mode while the diode is turned on, and applies the ground voltage as the second DC voltage to the second node in a second operation mode while the diode is turned off.

7. The discrete capacitance switching circuit of claim 6, wherein the bias circuit applies a bias voltage greater than the ground voltage as the first DC voltage to the first node in the second operation mode, and applies the ground voltage as the second DC voltage to the second node in the first operation mode.

8. The discrete capacitance switching circuit of claim 7, wherein the bias voltage is about equal to or greater than a peak voltage of the AC signal.

9. The discrete capacitance switching circuit of claim 3, wherein the bias circuit comprises:
a chalk inductor connected between the first node and a switching node;
a first switch connected between the switching node and the reference node; and
a second switch connected between the switching node and a bias node that receives a bias voltage.

10. The discrete capacitance switching circuit of claim 9, wherein the diode is turned on when the first switch is turned on and the second switch is turned off, and the diode is turned off when the first switch is turned off and the second switch is turned on.

11. The discrete capacitance switching circuit of claim 9, wherein the bias circuit further comprises:
a DC inductor connected between the second node and the reference node.

12. The discrete capacitance switching circuit of claim 1, further comprising:
a reference capacitor connected between the power node and the reference node.

13. The discrete capacitance switching circuit of claim 12, wherein a total capacitance value of the unit capacitor and the reference capacitor is applied to the power node in a first operation mode while the diode is turned on, and a capacitance value of the reference capacitor is applied to the power node in a second operation mode while the diode is turned off.

14. The discrete capacitance switching circuit of claim 1, further comprising:
a bias generator configured to generate a bias voltage about equal to or greater than a peak voltage of the AC signal,
wherein the bias voltage is provided to the bias circuit.

15. A discrete capacitance switching circuit, comprising:
a direct current (DC) decoupling capacitor connected between a power node that receives an alternating current (AC) signal and a first node;
a diode comprising a cathode electrode connected to the first node and an anode electrode connected to a second node;
a unit capacitor connected between the second node and a reference node that receives a ground voltage;
a bias circuit configured to apply a first DC voltage to the first node and apply a second DC voltage to the second node, wherein the first DC voltage and the second DC voltage control a switching operation of the diode;
a chalk inductor connected between the first node and a switching node;
a first switch connected between the switching node and the reference node;
a second switch connected between the switching node and a bias node that receives a bias voltage;
a DC inductor connected between the second node and the reference node; and
a reference capacitor connected between the power node and the reference node.

16. The discrete capacitance switching circuit of claim 15, further comprising:
a bias generator configured to generate the bias voltage,
wherein the bias voltage is about equal to or greater than a peak voltage of the AC signal, and the bias voltage is applied to the bias node.

17. The discrete capacitance switching circuit of claim 15, wherein the diode is turned on when the first switch is turned on and the second switch is turned off, and the diode is turned off when the first switch is turned off and the second switch is turned on.

18. A capacitor array circuit, comprising:
a reference capacitor connected between a power node that receives an alternating current (AC) signal and a reference node that receives a ground voltage; and
a plurality of discrete capacitance switching circuits connected in parallel between the power node and the reference node,
wherein each of the plurality of discrete capacitance switching circuits comprises:
a direct current (DC) decoupling capacitor connected between the power node and a first node;
a diode connected between the first node and a second node;
a unit capacitor connected between the second node and the reference node; and
a bias circuit configured to apply a first DC voltage to the first node and apply a second DC voltage to the second node, wherein the first DC voltage and the second DC voltage control a switching operation of the diode.

19. The capacitor array circuit of claim 18, further comprising:
a plurality of unit capacitors respectively included in the plurality of discrete capacitance switching circuits,
wherein the unit capacitor is one of the plurality of unit capacitors, and the unit capacitors have a same capacitance value.

20. The capacitor array circuit of claim 18, further comprising:
a plurality of unit capacitors respectively included in the plurality of discrete capacitance switching circuits,
wherein the unit capacitor is one of the plurality of unit capacitors, and the unit capacitors have different capacitance values.

* * * * *